(12) United States Patent
Hiratani et al.

(10) Patent No.: US 6,867,090 B2
(45) Date of Patent: Mar. 15, 2005

(54) SEMICONDUCTOR DEVICE AND METHOD OF MANUFACTURING THEREOF

(75) Inventors: Masahiko Hiratani, Akishima (JP); Shinichiro Kimura, Kunitachi (JP); Tomoyuki Hamada, Chiba (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/421,903

(22) Filed: Apr. 24, 2003

(65) Prior Publication Data

US 2003/0201485 A1 Oct. 30, 2003

Related U.S. Application Data

(62) Division of application No. 09/930,144, filed on Aug. 16, 2001, now Pat. No. 6,576,928.

(30) Foreign Application Priority Data

Nov. 22, 2000 (JP) ..................................... 2000-360707

(51) Int. Cl.[7] ........................................ H01L 21/8242
(52) U.S. Cl. ...................... 438/243; 438/386; 257/68; 257/301; 257/552
(58) Field of Search .................. 257/532, 534, 257/301–305, 68; 438/243, 386, 242, 957

(56) References Cited

U.S. PATENT DOCUMENTS

| 5,520,992 A | 5/1996 | Douglas et al. ............. 428/209 |
| 6,222,722 B1 | 4/2001 | Fukuzumi et al. .......... 361/305 |

FOREIGN PATENT DOCUMENTS

| JP | A3136361 | 6/1991 |
| JP | 5090219 | 4/1993 |
| JP | 9-2869 | 1/1997 |
| JP | 9142844 | 6/1997 |
| JP | 10-93051 | 4/1998 |
| JP | 10-182221 | 7/1998 |
| JP | 10247723 | 9/1998 |
| JP | 11-16624 | 1/1999 |
| JP | 11251550 | 9/1999 |

OTHER PUBLICATIONS

1999 Symposium onVISI Technology, Digest of Technical Papers, pp. 99–100.
Journal of Research of the National Bureau of Standards, vol. 72A, 1968, pp. 175–186.
Acta Cryst. vol. 14, 1961, pp. 1278–1281.
Japanese Journal of Applied Physics, vol. 6, 1967, pp. 21–34.
Sov. Phys. Cyrstallogr. vol. 24, 1979, pp. 537–539.
Sov. Phys. Crystallogr. vol. 25, 1980, pp. 669–672.
Extended Abstracts of the 1991 International Conference on Solid State Devices and Materials, pp. 198–200.
Extended Abstracts of the 1997 International Conference on Solid State Devices and Materials, pp. 36–37.

*Primary Examiner*—Nathan J. Flynn
*Assistant Examiner*—Scott R Wilson
(74) *Attorney, Agent, or Firm*—Mattingly, Stanger & Malur, P.C.

(57) ABSTRACT

By using a solid solution of tantalum pentoxide and niobium pentoxide as a dielectric film installed between upper electrode and lower electrode in a capacitor which is used in a semiconductor device, the capacitor structure can be simplified to improve reliability of the semiconductor device while reducing the production cost thereof.

10 Claims, 6 Drawing Sheets

SEMICONDUCTOR DEVICE AND METHOD OF MANUFACTURING THEREOF

This is a divisional application of U.S. Ser. No. 09/930,144, filed Aug. 16, 2001 now U.S. Pat. No. 6,576,928.

BACKGROUND OF THE INVENTION

This invention relates to a semiconductor device containing a capacitor wherein a metal oxide of tantalum pentoxide, and the like, is used as dielectrics and a method for manufacturing thereof.

In semiconductor devices having LSI such as dynamic random access memory (DRAM), etc., the capacitor area is reduced with higher integration. Thus, there is studied application of metal oxide dielectrics such as tantalum pentoxide ($Ta_2O_5$) having high permittivity of several tens in place of the silicon oxide which has been used as capacitor dielectric film. Further, in gigabit generation semiconductor devices wherein the minimum processing size is 0.15 $\mu$m or less, it is necessary to form a dielectric film by using a CVD (chemical vapor deposition) method on a surface of deep hole or concave in order to enhance capacitance, even if metal oxide dielectrics having a higher permittivity are used.

High dielectric $Ta_2O_5$'s applied so far can be summarized as follows.

1) In a capacitor using MIS (metal-insulator-semiconductor)-$Ta_2O_5$ film, the permittivity increases to 40 at most depending on conditions of CVD method and heat treatment. It is estimated that the crystal phase transfers to a $\delta$ phase, but this is not identified precisely.

2) MIM (metal-insulator-metal)-$Ta_2O_5$ film has a large permittivity of from 40 (formed by CVD) to 80 (formed by sputtering) depending on film preparation and heat treatment conditions. It is estimated that the crystal phase transfers to a $\delta$ phase, but this is not identified.

3) $Ta_2O_5$ film obtained by adding $TiO_2$ or $Al_2O_3$ and heat-treated at about 1400° C. has a high permittivity of 126 at most. The crystal phase is monoclinic H' phase or a mixture, respectively.

However, the high dielectric $Ta_2O_5$'s mentioned above have problems mentioned below, respectively.

First, in the case of MIS-$Ta_2O_5$ formed on a silicon nitride film, the permittivity is higher than a typical value of 25 of the L phase, but retains at about 40. Next, in the case of Ta2O5 formed on Pt by a sputtering method, the permittivity is as high as 75 or more, but the preparation temperature is as high as 550° C. Considering application to devices, for example, in order to form a $Ta_2O_5$ film uniformly on inner walls of a deep hole by using a CVD method, it is required a technology to form the film at a temperature of 500° C. or less. In the case of forming high dielectric $Ta_2O_5$ on Ru, a heat treating temperature of 750° C. or higher is necessary. Considering application to device processes, technology of reducing to the temperature of 700° C. or less is required. In addition, properties of these MIM and MIS capacitors are largely dependent on preparation conditions and heat treating conditions, and lack in reproducibility. As to the addition of $TiO_2$ and $Al_2O_3$, since high temperature heat treatment of 1400° C. is necessary, application to the device processes is impossible.

BRIEF SUMMARY OF THE INVENTION

An object of the present invention is to provide a semiconductor device containing MIS or MIM capacitor having hexagonal phase and permittivity of 50 or more. More concretely, by using a dielectric film made of a solid solution of tantalum pentoxide and niobium pentoxide with a film thickness of 10 nm or less, the above object is attained.

Another object of the present invention is to provide a method of manufacturing such a semiconductor device.

DETAILED DESCRIPTION OF THE INVENTION

In the present specification, the term "tantalum pentoxide" or "$Ta_2O_5$" does not always mean a substance having a definite composition of Ta and O strictly. Further, the term "(tantalum, niobium) pentoxide" or "$(Ta,Nb)_2O_5$" is used for a solid solution of tantalum oxide and niobium oxide wherein a part of tantalum element is substituted with niobium element. When all of tantalum element is substituted with niobium element to give pure niobium oxide, the term "niobium pentoxide" or "$Nb_2O_5$" is used. In addition, even if the terms "$Ta_2O_3$" and "$(Ta,Nb)_2O_5$" are used, explanation will be specified by the difference in crystal symmetry (hexagonal, orthorhombic, etc.).

A semiconductor device having $Ta_2O_5$ as a capacitor film is disclosed, for example, in 1999 Symposium on VLSI Technology, Digest of Technical Papers, pp. 99–100. The permittivity is to be from 25 to 30. On the other hand, as to $Ta_2O_5$, there are known various polymorphs having different crystal structures. This is disclosed, for example, in Journal of Research of the National Bureau of Standards, vol. 72A, pp. 175–186 (1968). Since this is important for making the novelty of the present invention clearer, crystal structures known in $Ta_2O_5$ are explained first, followed by explanation on a relation between the crystal structure and permittivity.

As thermodynamically stable phases, there are known two phases, that is, an L phase (or beta phase) which is a low temperature phase, and an H phase which is stabilized at higher temperature than the L phase. Usually, $Ta_2O_5$ means the L phase having orthorhombic phase. This is a phase stable in a temperature range from about 950° C. to 1350° C. thermodynamically. In order to obtain the L phase having complete crystal structure, it is necessary to anneal at near 1350° C., which is a phase transition temperature between the L phase and the H phase, for a long period of time. When the H phase is quenched from the stable temperature region to room temperature, various phases are frozen as meta-stable phases. One of them is a phase called as H' belonging to a monoclinic system.

Figure 6:
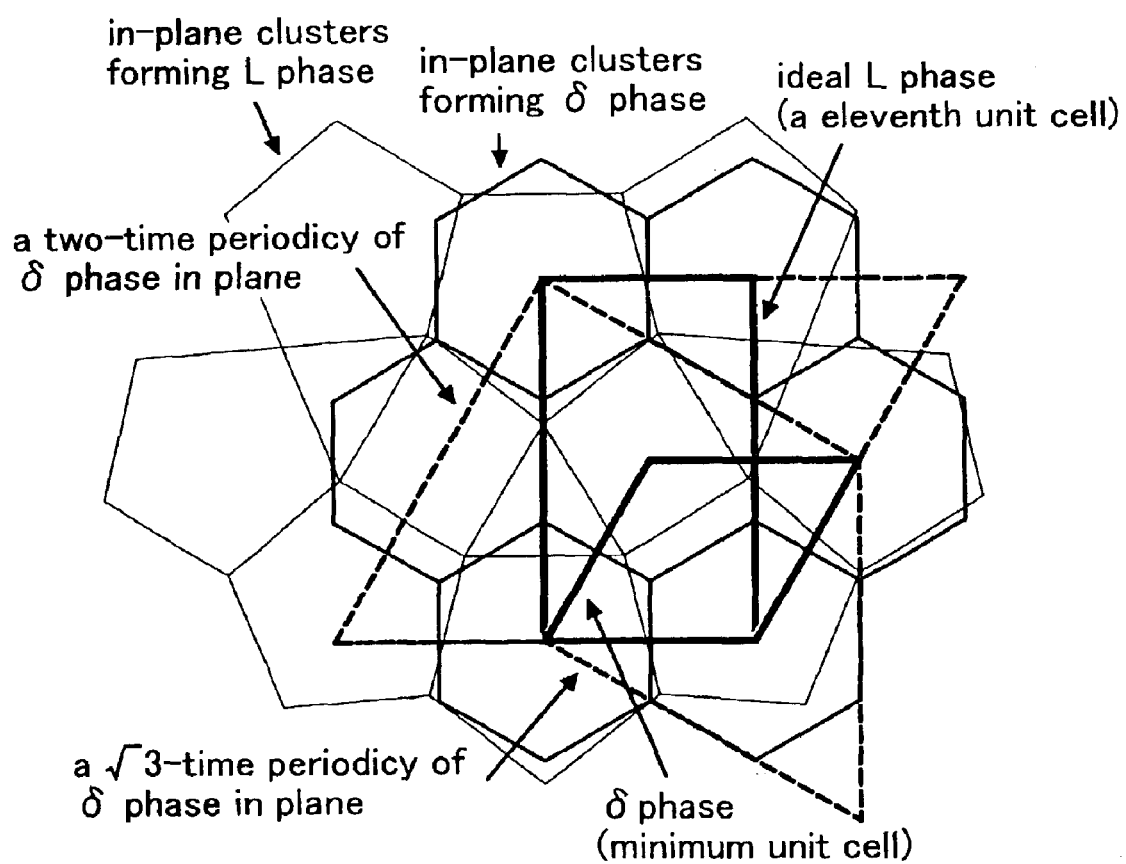
FIG. 6 is a drawing for comparing a mutual relation of crystal lattices among orthorhombic L phase and hexagonal $\delta$ phase in polymorph of $Ta_2O_5$ and related hexagonal system using Ta—O coordinated polyhedra.

Explanation is made as to a hexagonal phase which is obtained at a lower temperature than the L phase. First, the L phase is compared with the hexagonal phase using FIG. 6. Each polygon (polygons shown by hexagons and dotted lines) is a coordinated polyhedron cluster showing atomic arrangement at the Z=0 plane including Ta atom. Tantalum ion occupies the center of each polygon. Oxygen atom occupies upper and lower apical sites of the tantalum ion (corresponding to upper and lower directions of this paper) and corner site (corresponding to corners of polygons on this paper). The thin line constituting a pentagon shows a cluster at the L phase and the thick line constituting the hexagon shows a cluster of hexagonal phase such as the δ phase. In the L phase cluster, Ta ion is five-or four-fold-coordinated by the oxygen ions in the plane or two-fold-coordinated by the oxygen ions at upper and lower to form pentagonal bi-pyramid or square bi-pyramid cluster. These give unit cells represented by "ideal L phase". But in practice, the cluster is deformed by steric hindrance and at the same time, since partial deficiency is introduced into special oxygen sites, symmetry is lowered. As a result, the practical unit cell of L phase has a long periodicity of 4 nm which value is 11 times as large as the "ideal L phase" in the drawing in the horizontal direction.

On the other hand, in the case of the hexagonal phase, since the steric hindrance is relaxed by introducing vacancies into oxygen sites statistically, a hexagonal bi-pyramid cluster constituted by edge-shared hexagons is formed in the plane as shown in the drawing. Particularly, the δ phase is a hexagonal phase constituted by the "minimum unit cell" having a lattice constant of 0.4 nm or less. With a decrease of symmetry of the δ phase, there can be obtained a similar hexagonal having a period of "twice as large as the δ phase in the plane" or "√3 as large as the δ phase in the plane" as shown in the drawing. Details of these hexagonal crystals are described in, for example, Acta Cryst., vol. 14, pp. 1278–1281 (1961); Japanese Journal of Applied Physics, vol. 6, pp. 21–34 (1967); Sov. Phys. Crystallogr., vol. 24, pp. 537–539 (1979); and Sov. Phys. Crystallogr., vol. 25, pp. 669–672 (1980).

Hexagonal tantalum pentoxide represented by the δ phase can be obtained by heating amorphous tantalum oxide from room temperature or subjecting a tantalum thin film or tantalum foil to oxidizing heat treatment from room temperature. These hexagonal crystals have characteristics in that they can be prepared at low temperatures, and they are more stable in the state of a thin film having a film thickness of 40–60 nm. As explained in FIG. 6, the crystal lattice of L phase has a long periodicity of 4 nm in the monoaxial direction. Therefore, in the L phase thin film, the number of unit cells in the film thickness direction decreases with decreasing film thickness, for example, 10 unit cells at the thickness of 40 nm and 3 unit cells at the thickness of 12 nm. As a result, when the film thickness is decreased to several times of the long periodicity (30–40 nm), the crystal lattice of the L phase becomes unstable, and the crystal structure is transformed to hexagonal crystals having a smaller periodicity length of 0.4 nm or less. Thus, the lower the temperature and thinner the film thickness become, the hexagonal structure is formed more stably.

Figure 7:
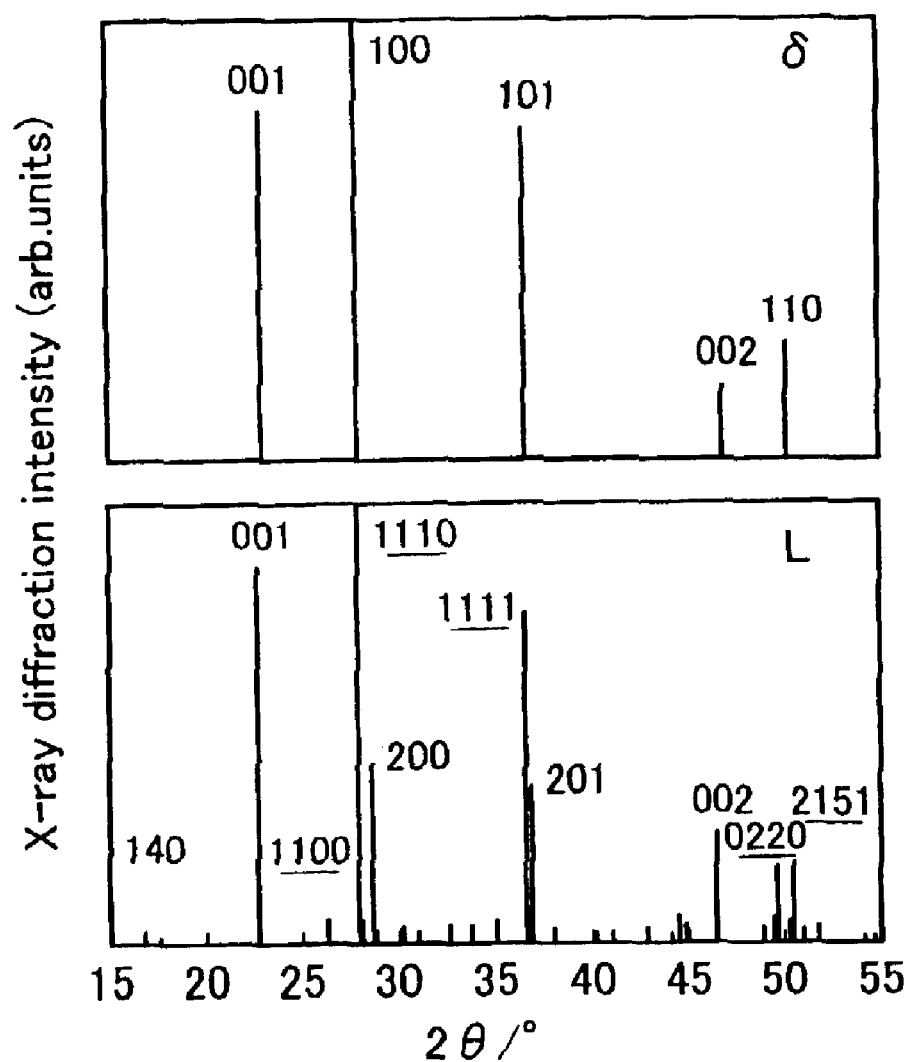
FIG. 7 is X-ray diffraction patterns for explaining similarity of orthorhombic L phase and hexagonal $\delta$ phase in polymorph of $Ta_2O_5$.

In order to identify the L phase and the hexagonal phase separately from crystallographical viewpoint, it is necessary to conduct structural analysis in detail. In FIG. 7, X-ray diffraction patterns of the L phase and the δ phase are compared typically. As is easily understood, characteristic X-ray diffraction lines give almost the same diffraction angles and intensity ratios in both phases. Further, since the diffraction line intensity is weak in a thin film, it is difficult to revert to a weal diffraction line specific to the long-range structure of the L phase. In addition, in the case of a polycrytal thin film having a small film thickness of 50–60 nm, since the diffraction line broadens, it is difficult to find out splitting of main diffraction lines shown in the L phase (e.g. 1, 11, 0 and 200; 1, 11, 1 and 201). In order to distinguish the L phase and the δ phase from the results of X-ray diffraction, it is necessary to discuss the lattice constants in detail. In addition, in order to determine a hexagonal crystal including the δ phase, it is most desirable to find out in-plane 6-fold symmetry. This can be applied to similar hexagonal crystals.

The relation between various phases of $Ta_2O_5$ and permittivity is explained below.

As explained above, it is probable that the term "$Ta_2O_5$" means the L phase and its permittivity is 25–30. As to the H phase, since a meta-stable phase such as H' phase is easily crystallized at room temperature, its permittivity is hardly known.

As to the hexagonal phase, there are some reports on thin films aimed at for application to semiconductor devices. A capacitor structure formed on a silicon nitride film or a semiconductor electrode such as-silicon is called as MIS capacitor (MIS: metal-insulator-semiconductor).

It is disclosed in Extended Abstracts of the 1991 International Conference on Solid State Devices and Materials, pp.198–200 that from X-ray structural analysis, the crystal structure of MIS-$Ta_2O_5$ film formed on a silicon substrate by CVD method is the δ phase and its permittivity is about 12.

Another example of prior art reporting analysis of the δ phase and its permittivity of 40 is disclosed in JP-A 11-16624, wherein MIS-$Ta_2O_5$ is formed by CVD method on polycrystal silicon electrode surface of which is nitrogenized, followed by heat treatment at 700 to 900° C. for 1 minute in a pure oxygen environment. Since identification of the δ phase is derived from X-ray diffraction results without arguments of lattice constants, the resulting crystal structure analysis is incomplete.

From total judgement of above-mentioned two examples of prior art, it is estimated that the capacitor using the MIS-$Ta_2O_5$ film as an insulating film has permittivity of 40 at most depending on conditions of CVD method and heat treatment conditions and its crystal phase is the δ phase.

It is also known that such $Ta_2O_5$ having a large permittivity is formed on an electrode made of a noble metal such as Ru, Pt, etc. The capacitor structure formed on such a metal electrode is called as MIM capacitor (MIM: metal-insulator-metal). For example, JP-A 10-93051 discloses that the MIM-$Ta_2O_5$ film formed on Pt by sputtering at a temperature of 550° C. or higher shows permittivity of as high as 75 to 80. Further, the crystal structure determined by X-ray diffraction shows hexagonal δ phase having a lattice constant increased by 1 to 3% compared with a bulk material. But in this reference, no detailed data supporting this is disclosed. The formation of high dielectric MIM-$Ta_2O_5$ on Ru, is disclosed in Extended Abstracts of the 1997 International Conference on Solid State Devices and Materials, pp. 36–37. The $Ta_2O_5$ film formed on Ru and Pt by CVD method, followed by heat treatment at 750° C. or higher, shows a high permittivity of 60 at most. The crystal structure is revealed by X-ray diffraction to be the L phase wherein the c axis is oriented. It is also disclosed in JP-A 11-16624 that MIM-$Ta_2O_5$ formed on Ru or Pt shows a high permittivity of about 40. The crystal structure is revealed by X-ray diffraction to be δ phase.

By totally judging the above-mentioned three examples of prior art relating to the MIM-$Ta_2O_5$, the permittivity is greatly dependent on preparation and heat treatment conditions and shows a large value of 40 to 80. The crystal structure is estimated to be the δ phase.

On the other hand, it is reported that the permittivity is increased by doping an element to $Ta_2O_5$. When $Ta_2O_5$ is doped with $TiO_2$ in an amount of 8%, the permittivity is increased to 126 at most. The crystal structure of $Ta_2O_5$ is revealed to be H' belonging to monoclinic system by the results of X-ray diffraction. But, in order to form this phase, it is necessary to subject to heat treatment at a high temperature of 1350° C. to 1400° C. This example is disclosed in detail in JP-A 9-2869. When $Ta_2O_5$ is doped with $Al_2O_3$ in an amount of 10%, the permittivity increases to about 40. The crystal phase is estimated to be a mixture of a $Ta_2O_5$ type solid solution and $AlTaO_4$. But, in order to obtain this phase, it is necessary to subject to heat treatment at a high temperature of 1400° C. This example is disclosed in detail in JP-A 10-182221.

Considering all of the prior art references mentioned above, a basic technology for applying $Ta_2O_5$ having a permittivity of 50 or higher to semiconductor devices as MIS and MIM capacitors is not yet established. This is because, first of all, it is not understood why the permittivity of $Ta_2O_5$ increases, what is a relation between the high dielectric constant and the crystal structure, and what are concrete and the most suitable conditions for practicing this. In order to respond to all of the questions mentioned above, it is necessary to understand basic mechanisms thereof and at the same time to develop applied technology thereof. Thus, it becomes possible to apply the $Ta_2O_5$ having a permittivity of 50 or more to semiconductor devices as capacitor insulating films.

In order to solve the above-mentioned problems of $Ta_2O_5$ capacitors, the present inventors have found the following facts mentioned below and attained a high dielectric capacitor applying this and process for producing the same.

First, the most basic mechanism for making the $Ta_2O_5$ film to have high permittivity is explained. Then, to use a solid solution of $Nb_2O_5$ and $Ta_2O_5$, that is, $(Ta,Nb)_2O_5$ as an effective means is explained. Further, a process for manufacturing a semiconductor device having a high permittivity hexagonal $(Ta,Nb)_2O_5$ film as a capacitor is explained.

Figure 8A:
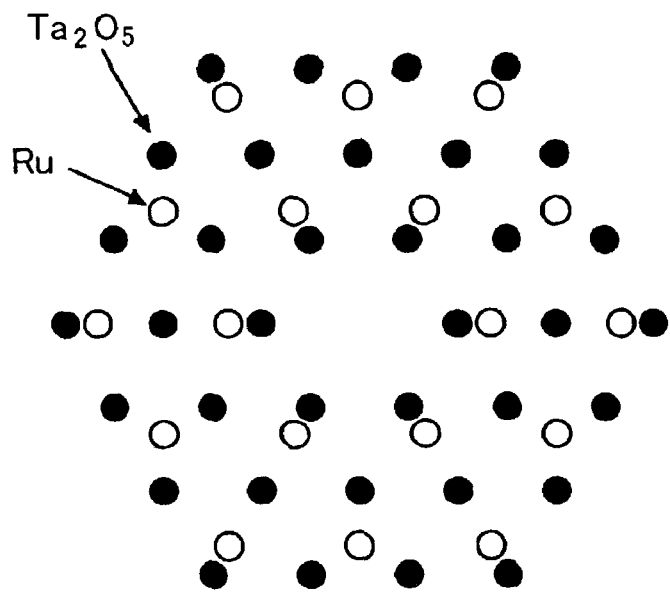
FIG. 8 is drawings showing that the crystal structure of MIS- and MIM-$Ta_2O_5$ film having a film thickness of 10 nm or less is hexagonal, and (a) is an electron diffraction pattern in nano-area showing clearly that the MIM-$Ta_2O_5$ film formed on the Ru electrode shows six-fold symmetry, and (b) is an X-ray diffraction pattern showing that the MIS-$Ta_2O_5$ film formed on the polysilicon electrode covered with silicon nitride film has a crystal structure of hexagonal phase.

FIG. 8(a) is a nano-area electron diffraction pattern of the $Ta_2O_5$ film having permittivity of as large as 50 and a film thickness of 9 nm obtained by forming on a Ru electrode by CVD method at 480° C., and oxidation with ozone at 400° C., followed by crystallization treatment in nitrogen at 700° C. The diffraction image is re-drawn typically from diffraction points observed by a photograph. White circles mean diffraction points from the Ru film and black circles mean diffraction points from the $Ta_2O_5$ film. Both show clearly six-fold symmetry in plane. That is, the crystal structure of the $Ta_2O_5$ film on the Ru and having a large permittivity of 50 in the MIM capacitor is not the L phase, but obviously the hexagonal phase. This is a result of stabilization of the hexagonal $Ta_2O_5$ by the six-fold symmetry of Ru at the (001) plane. The hexagonal $Ta_2O_5$ film was also observed in the crystallization treatment at 600° C. When the unit cell was analyzed as the smallest δ phase, the lattice constant was a=0.363 nm and C=0.389 nm. It is possible that the hexagonal phase can be that with 2- or √3-times of basal plane or that with multiplied thereof as explained in FIG. 6, other than the δ phase. The film formed on the Pt was identified as the hexagonal phase in the same manner as mentioned above. In this case, the hexagonal $Ta_2O_5$ was stabilized by the three-fold symmetry of Pt at the (111) plane. Further, the three-fold symmetry of Pt and the six-fold symmetry of Ru are not always parallel to the growth plane of film. That is, the $Ta_2O_5$ with six-fold symmetry grew even on a Pt or Ru film having random orientation similarly. This was a result of growth of $Ta_2O_5$ with six-fold symmetry or the step edge and latenal planes with three- or six-fold symmetry of the Pr or Ru film surface. As mentioned above, the crystal structure of MIM-$Ta_2O_5$ having a permittivity of 50 or higher was confirmed clearly as the hexagonal crystal for the first time.

Another factor for crystallization of the hexagonal MIM-$Ta_2O_5$ at a low temperature of 600° C. is instability of the L phase having a long-range ordering structure due to a small film thickness of 10 nm or less. Conversely, when the heat treatment temperature is over 750° C. or lower than 600° C., the hexagonal crystal became unstable. When the growth temperature was over 500° C., the hexagonal crystal became unstable. In addition, when the film thickness was over 20 nm or less than 5 nm, the hexagonal crystal became unstable. That is, a technology for stabilizing the hexagonal MIM-$Ta_2O_5$ having a large permittivity has been developed.

Figure 8B:
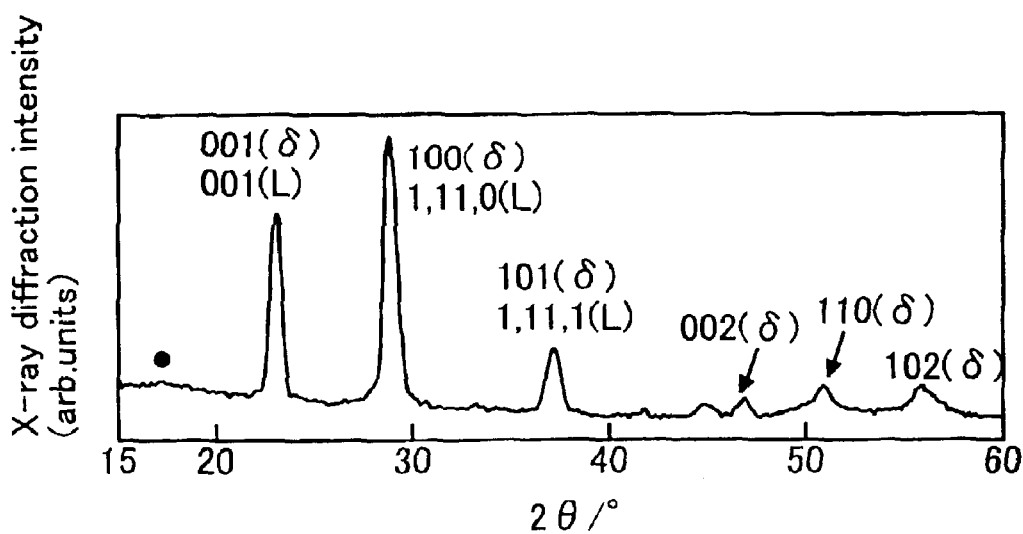

Next, X-ray diffraction pattern of the $Ta_2O_5$ film having a film thickness of 8 nm obtained by forming on polysilicon the surface of which was nitrogenated, by CVD method at 450° C., followed by oxidation and crystallization at 750° C. in oxygen is shown in FIG. 8(b). The diffraction lines near diffraction angles (horizontal axis 2θ) of 23°, 29°, and 37° are assigned to (001), (1,11,0) and (1,11,1) in the case of the L phase, and to (001), (100) and (101) in the case of the δ phase. If assigned to the L phase, there are obtained a=0.61 nm and c=0.388 nm. The a-axis length is 1.6% shorter than the L phase of powder (a=0.62 nm, c=0.389 nm). In addition, there is no information sufficient to determine as the L phase, for example, splitting of diffraction lines as explained in FIG. 7. If assigned to the δ phase, there are obtained lattice constant of a=0.358 nm and c=0.389 nm. The a-axis length is 1.1% shorter than the δ phase of powder (a=0.362 nm, c=0.388 nm). But noticing the weak diffraction line observed near 17° (black-circle mark), and assuming this as hexagonal crystal having periodicity of √3 fold in the δ phase explained in FIG. 6, the diffraction lines near 17°, 23°, 29° and 37° are assigned to (100), (001), (110) and (111). In this case, the a-axis length becomes 0.620 nm, which value is in good agreement with the reported values (from 0.617 nm to 0.620 nm). Crystallization of this hexagonal MIS-$Ta_2O_5$ film was observed at a low temperature of 700° C. These MIS-$Ta_2O_5$ films showed a large permittivity of 60 to 70. That is, the crystal structure of the MIS-$Ta_2O_5$ film having a film thickness of 8 nm and permittivity of as large as 60 or more and obtained by oxidation and crystallization at 700° C. to 750° C. in oxygen was clearly found to be hexagonal crystal by lattice constant for the first time.

Another factor for crystallization of the hexagonal MIS-$Ta_2O_5$ at a low temperature of 700° C. is instability of the L phase having a long-range ordering structure due to a small film thickness of 10 nm or less. Conversely, when the heat treatment temperature is over 750° C. or lower than 700° C., the hexagonal crystal became unstable. When the growth temperature was over 500° C., the hexagonal crystal became unstable. In addition, when the film thickness was over 20 nm or less than 5 nm, the hexagonal crystal became unstable. That is, a technology for stabilizing the hexagonal MIS-$Ta_2O_5$ having a large permittivity has been developed.

As explained in both MIS and MIM, the present inventors have found clearly for the first time that the factor for increasing the permittivity of $Ta_2O_5$ to 50 or more is dependent on the hexagonal structure. At the same time, the present inventors have developed a technology for preparation thereof. In the present invention, there are provided a process for more stabilizing hexagonal $Ta_2O_5$ having a high permittivity crystallographically and a process for more increasing the permittivity. These process are explained below using a dielectric film made of a solid solution of niobium pentoxide and tantalum pentoxide.

$Nb_2O_5$ is a homologous compound of $Ta_2O_5$. It is known that $Nb_2O_5$ has a long-range structure as in $Ta_2O_5$. As disclosed in Powder Diffraction, vol. 1, p. 342 (1986), the primitive axis length of the two is as long as 2 nm. On one hand, existence of the hexagonal phase is also known. This is disclosed in detail in Japanese Journal of Applied Physics, vol. 2, pp. 156–174 (1963). That is, when the film thickness is made small as in the case of $Ta_2O_5$, the long-range structure becomes unstable and the hexagonal structure having small lattices is stabilized. Thus, the present inventors considered that by solving niobium pentoxide into tantalum pentoxide to form a solid solution, the hexagonal structure is more stabilized. In fact, by using pentaethoxytantalum and pentaethoxyniobium as raw materials, it was possible to form a whole range solid solution film of tantalum pentoxide and niobium pentoxide having a film thickness of 10 nm by CVD method. Further, not depending on MIS- and MIM capacitor structures, and not depending on solid solution composition of $(Ta,Nb)_2O_5$, it was possible to express the in-plane lattice constant by periodicity of 0.36 nm (supposing the δ phase) or multiplication thereof in integral number, or 0.63 nm which is obtained by multiplying 0.36 nm by √3, or multiplication thereof in integral number. This is the same correlation as the hexagonal crystal lattice explained in FIG. 6.

Figure 4:
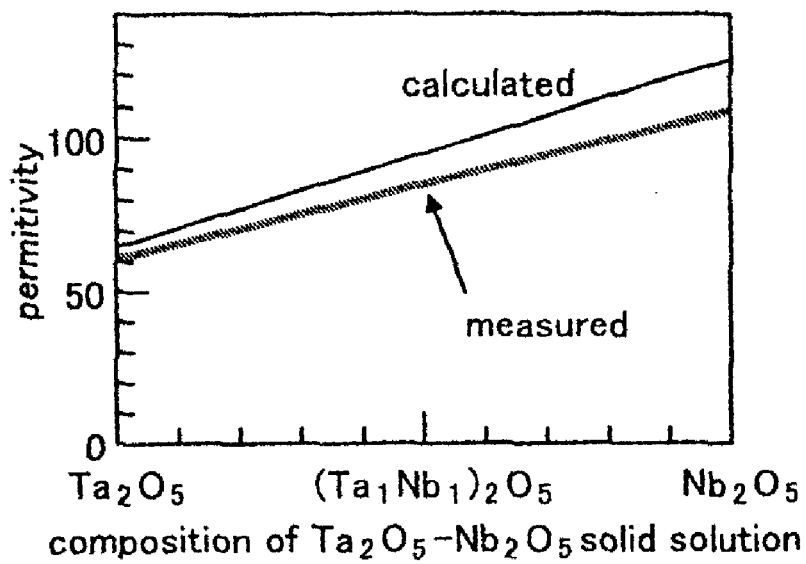
FIG. 4 is a graph for explaining high dielectric constant of the dielectric film made of $(Ta,Nb)_2O_5$ solid solution in Example 1.

Further, as shown in FIG. 4, as a result of estimated calculation of permittivity from polarizability, it was revealed that the permittivity of hexagonal δ phase increases 2 times from 62 to 123 with a change of composition from $Ta_2O_5$ to $Nb_2O_5$. Then, a MIM capacitor was made from a solid solution thin film of $(Ta,Nb)_2O_5$ having a film thickness of 9 nm by using CVD method at a preparation temperature of 460° C. and heat treatment temperature of 600° C. and subjected to examination of changes of permittivity. The results are also shown in FIG. 4. As expected from the results of calculation, the permittivity of the thin film was increased from 60 to 100. The same increase of the permittivity was admitted in the MIS capacitors.

Finally, impurities in CVD raw materials are explained. In the case of solid solution of $Ta_2O_5$ and $Nb_2O_5$, permittivity increases with an increase of substituted amount of Nb. On one hand, $Ta_2O_5$ dielectric film is now made by CVD method using pentaethoxytantalum as a raw material, wherein much labor and cost are used for reducing the amount of impurities for Nb in the raw material. But, from the viewpoint of electrical properties, even if impurities for Nb in the raw material are mixed into the dielectric film, no negative effect is produced. That is, it is not necessary to cost for reducing the Nb impurities in the pentaethoxytantalum. Conversely, it is also not necessary to cost for reducing Ta impurities in the pentaethoxyniobium. From practical level of contamination control in the production process of semiconductor devices, purity control in the production process of raw materials, etc., contamination of 1% or less of Nb impurities in pentaethoxytantalum CVD raw material and 1% or less of Ta impurities in pentaethoxyniobium CVD raw material is sufficiently permissible.

As mentioned above, properties of $(Ta,Nb)_2O_5$ solid solution can be summarized as follows.

(1) The principle of making a solid solution is based on stabilization of hexagonal crystal.
(2) By making the film thickness as thin as 10 nm or less, hexagonal crystal having a small periodic structure can be more stabilized.
(3) By increasing polarizability of inner crystal, while maintaining the same hexagonal as $Ta_2O_5$ in crystal structure, the maximum permittivity can be increased to 2 times.
(4) Since pentaethoxyniobium can be used as a CVD raw material as in the case of $Ta_2O_5$, it is possible to change to the solid solution process without largely modifying the $Ta_2O_5$ process now employed.
(5) It is not necessary to use high temperature treatment at 1400° C. which is necessary for Al or Ti in the process of prior art mentioned above.
(6) In CVD raw materials, Ta and Nb easily contain each other as an impurity. But, since the solid solution provides no negative effect on properties of capacitor dielectric film, there is no problem even if a trace of these impurities are included, respectively.

According to the present invention, preferable embodiments of the semiconductor device are as follows.

(A). A semiconductor device containing a capacitor, wherein the capacitor has a lower electrode and an upper electrode, and a dielectric film formed between the above-mentioned electrodes, said dielectric film being made of a solid solution of tantalum pentoxide and niobium pentoxide.

(B). A semiconductor device comprising
  a semiconductor substrate,
  an MOS transistor formed on a main surface of the semiconductor substrate,
  a plug electrically connected to a source region or a drain region of the MOS transistor,
  an insulating layer formed on the plug,
  a concave formed in the insulating layer, and
  a capacitor formed in the concave, wherein said capacitor comprising
  a lower electrode formed on at least inner side and bottom surface of the concave and electrically connected to the plug,
  a dielectric film made of a solid solution of tantalum pentoxide and niobium pentoxide and formed on the lower electrode, and
  an upper electrode formed on the dielectric film.

(C). A semiconductor device containing a capacitor, wherein the capacitor has a lower electrode and an upper electrode, and a dielectric film formed between the above-mentioned electrodes, said dielectric film being made of (tantalum, niobium)pentoxide.

(D). A semiconductor device comprising
- a semiconductor substrate,
- an MOS transistor formed on a main surface of the semiconductor substrate,
- a plug electrically connected to a source region or a drain region of the MOS transistor,
- an insulating layer formed on the plug,
- a concave formed in the insulating layer, and
- a capacitor formed in the concave, wherein said capacitor comprising
- a lower electrode formed on at least inner side and bottom surface of the concave and electrically connected to the plug,
- a dielectric film made of (tantalum, niobiuim)pentoxide and formed on the lower electrode, and
- an upper electrode formed on the dielectric film.

Next, a process for manufacturing the MIM capacitor having a hexagonal $(Ta,Nb)_2O_5$ solid solution film with high permittivity is explained. Needless to say, the same can be applied to the MIS-$(Ta,Nb)_2O_5$ capacitor to increase the permittivity. In the following, the MIM capacitor wherein the increasing effect is remarkable is explained.

Here, detailed explanation as to the steps before formation of the capacitor such as a step for forming MOS transistor, a step of forming a plug electrically connected from source and drain of the transistor, and a step of flattening, are omitted, these steps are conventional. The plug has an opening portion on the surface of the planarized silicon oxide film. The opening portion has an electrode made of a noble metal such as Pt, Ru, etc., or barrier metal such as TiN, Si-doped TiN, Al-doped TiN, TaN, Si-doped TaN, etc. After forming a silicon nitride film as an etching stopper on the planarized surface having the plug opening portion, an interlaminar insulating layer ($SiO_2$) having a thickness of from 1 to 2 μm is deposited. In this interlaminar insulating layer, a deep concave is formed so as to be connected to the plug opening portion through the silicon nitride film. There is no limitation to the shape of deep concave, but the larger the inner surface of the concave becomes, the larger the capacity of capacitor becomes. In the following explanation, a capacitor dielectric film is formed only in inside of the concave, but there is no problem even if the capacitor is formed on a part of outside of the concave or whole of outside of the concave.

On the interlaminar insulating film forming the concave, Ru or Pt electrode having a thickness of 40–60 nm is formed by CVD method. Then, only the film or the planarized surface around opening portion is removed by etch-back or the like technique so as to electorically isolate neighboring capacitors. Here, in order to suppress thermal deformation of the electrode in the subsequent steps, the electrode can be heat treated in an inert gas environment at a temperature of, e.g. from 500° C. to 700° C. On the electrode, a dielectric film of $(Ta,Nb)_2O_5$ solid solution having a thickness of 10 nm or less is formed by using CVD method. As the CVD raw materials, there can be used independent two systems of pentaethoxytantalum and pentaethoxyniobium, or mixed precursors of pentaethoxytantalum and pentaethoxyniobium in arbitrary compositions. The preparation temperature should be 500° C. or lower in order to suppress generation of unevenness of electrode surface owing to oxidation during film formation, considering uniform formation of the $(Ta,Nb)_2O_5$ dielectric film on inner side of the concave as well as stabilization of the hexagonal structure. Then, the $(Ta,Nb)_2O_5$ film is heat treated at a temperature of from 550° C to 700° C. The solid solution doped with Nb requires crystallization temperature of 50° C. lower than that of pure $Ta_2O_5$. In the MIS capacitor, this heat treatment temperature range is 650° C. to 750° C., which temperature range is higher than the crystallization temperature necessary for MIM. This is because on the Pt or Ru electrode, the hexagonal crystal with high permittivity is crystallized at a lower temperature due to influence of three- or six-fold symmetry of the electrode. Over this temperature, the hexagonal crystal becomes unstable, and under this temperature, sufficient crystallization of the hexagonal crystal cannot be obtained. As to the formation of upper electrodes, interlaminar insulating films, wiring layers, and the like in the subsequent steps, there can be employed conventional steps.

The process for producing the semiconductor device according to the present invention can be provided as follows.

(i). A method for manufacturing a semiconductor device, which comprises
- a step of forming a concave in an insulating layer,
- a step of forming a lower electrode on at least inner side wall or bottom surface of the concave,
- a step of forming a dielectric film made of a solid solution of tantalum pentoxide and niobium pentoxide having a thickness of 10 nm or less by a chemical vapor deposition method using a cocktail source of pentaethoxytantalum and pentaethoxyniobium on the lower electrode, and
- a step forming an upper electrode on the dielectric film, wherein a capacitor comprising the lower electrode, the dielectric film and the upper electrode.

(ii). A method described in above (i), wherein the step of forming the lower electrode is carried out by chemical vapor deposition method wherein a solution obtained by dissolving bis(ethylcyclopentadienyl)ruthenium in tetrahydrofuran in a concentration of 0.1 mole/liter is liquid transferred.

(iii). A method described in above (i), wherein the step of forming the lower electrode is carried out by chemical vapor deposition method wherein a solution obtained by dissolving (methylcyclopentadienyl)trimethylplatinum in tetrahydrofuran in a concentration of 0.1 mole/liter is liquid transferred.

The present invention is illustrated by way of the following Examples, but needless to say the present invention is not limited thereto.

EXAMPLE 1

Figure 1:
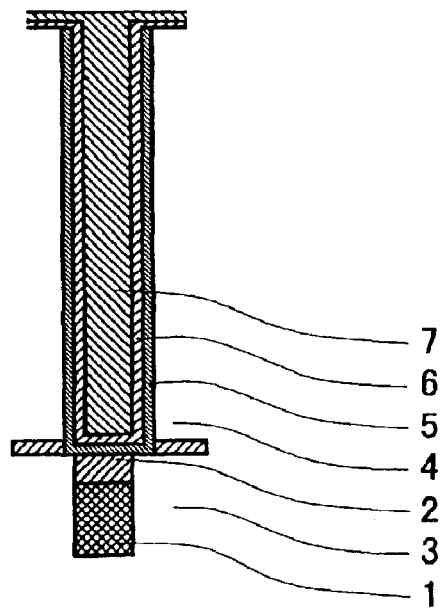
FIG. 1 is a longitudinal cross-sectional view for explaining steps of Example 1 of the present invention.

Example 1 is explained referring to FIG. 1. This Example is to explain steps for preparing capacitor using Pt or Ru electrode as a lower electrode and using a $(Ta,Nb)_2O_5$ solid-solution dielectric film with permittivity of as high as 50 or more as MIM capacitor. The solid-solution dielectric film was prepared by CVD method. The composition of solid solution was changed by independently transferring pentaethoxytantalum and pentaethoxyniobium. The explanation for steps before the formation of buried plug are omitted, since these steps are conventional.

On plug 1 to be laminated, Al-doped TiN barrier metal 2, and a plug portion interlaminar insulating layer 3 made of $SiO_2$, a capacitor portion interlaminar insulating film 4 was deposited by plasma CVD method using a monosilane gas as a raw material. After forming a W film by sputtering, a resist was coated to process a W mask by a conventional photolithography, followed by dry etching of the capacitor portion interlaminar insulating film 4 until the surface of the barrier metal 2 to form a deep concave for forming lower electrodes 5.

Then, the lower electrodes 5 having a film thickness of 25 nm was deposited by a chemical vapor deposition method. As the lower electrodes, Ru and Pt were used. The Ru electrode was formed by CVD technique wherein a solution obtained by dissolving an organometal complex, bis-(ethylcyclopentadienyl)-ruthenium [Ru($C_2H_5$—$C_5H_5$)$_2$] in tetrahydrofuran [$C_4H_8O$] in a concentration of 0.1 mol/liter was liquid delivered. In a shower head opposite to a substrate, the liquid raw material was mixed with an oxygen gas and a nitrogen gas, followed by blowing to the substrate. The preparation temperature was 290° C. and the pressure was 5 Torr. The Pt electrode was formed by CVD technique wherein a solution obtained by dissolving an organometal complex, (methylcyclopentadienyl)-trimethylplatinum [$CH_3C_5H_5Pt(CH_3)_3$] in tetrahydrofuran [$C_4H_6O$] in a concentration of 0.1 mol/liter was liquid delivered. In a shower head opposite to a substrate, the liquid raw material was mixed with a gas mixture of an oxygen gas and a nitrogen gas (7:1), followed by blowing to the substrate. The preparation temperature was 250° C. and the pressure was 5 Torr.

Then, a $(Ta,Nb)_2O_5$ solid-solution dielectric film 6 was formed by a chemical vapor deposition method. As precursors, pentaethoxytantalum [$Ta(OC_2H_5)_5$] and pentaethoxyniobium [$Nb(OC_2H_5)_5$] were used. Each raw material was transferred independently, while controlling the supply rate by mass-flow meter to form a $(Ta_{1-x}Nb_x)_2O_3$ solid-solution thin film having an arbitrary composition (x being a number between 0 and 1). Other preparation conditions were as follows: in a mixed gas of $N_2/O_2$ (pressure ratio $N_2/O_2$=2/1) at 0.5 Torr, substrate temperature 460°, and film thickness 9 nm. In order to accelerate crystallization of the solid-solution dielectric film, heat treatment was conducted in a nitrogen stream at 650° C. for 2 minutes and in an oxygen stream at 600° C. for 1 minute. Subsequently, upper electrodes 7 made of the same materials as the lower electrodes were prepared in the same manner as described above.

In the above, Al-doped TiN as the barrier metal, Ru and Pt as upper and lower electrodes were used for producing the semiconductor device. But, raw materials can be employed in a broad range; for example, even if pure TiN, TaN, Si-doped TaN, etc. were used in place of the Al-doped TiN, the same effects as those obtained by using the Al-doped TiN wherein mutual diffusion between plug components and lower electrode was suppressed, while keeping good electrical contact, were obtained. There is no problem when TiN formed by CVD method is used as the upper electrode.

EXAMPLE 2

Figure 2:
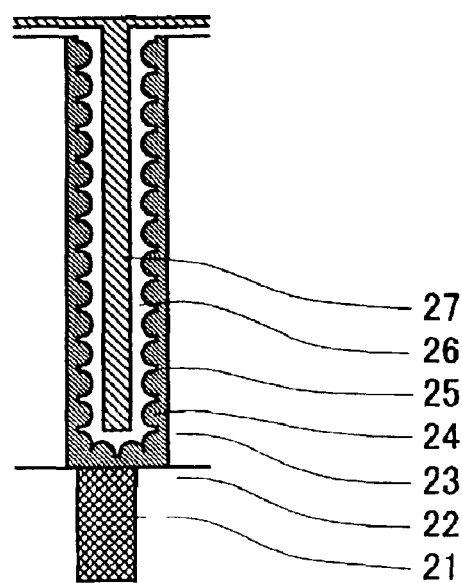
FIG. 2 is a longitudinal cross-sectional view for explaining steps of Example 2 of the present invention.

Example 2 is explained referring to FIG. 2. This Example is to explain steps for preparing a capacitor using $Ta_2O_5$ or $Nb_2O_5$ dielectric film in a MIS capacitor using a polysilicon electrode covered with a silicon nitride film.

First, on a polysilicon plug 21 and a plug portion insulating layer 22 made of $SiO_2$, a capacitor portion insulating film 23 made of $SiO_2$ and having a film thickness of 2000 nm was deposited by plasma CVD method using monosilane gas as a raw material. After forming a W film by sputtering, a resist was coated to process a W mask by a conventional photolithography, followed by dry etching of the capacitor portion insulating film 23 until the surface of the polysilicon plug to form a deep concave for forming lower electrodes 24.

Next, an electroconductive amorphous silicon layer with a thickness of 20 nm was formed on inner surface of the deep concave and upper surface of the capacitor insulating film 23, followed by removal of the amorphous silicon layer on the upper surface of capacitor insulating film by lithography and etching process, while retaining the amorphous silicon layer only in the inner side of the deep concave. After seeding silicon on the inner surface of deep concave, crystallization was conducted by heat treating at 630° C. and at the same time the surface was made uneven to form polysilicon electrode 24. After doping P on this surface by using $PH_3$, a silicon nitride film 25 was formed on the surface by $NH_3$ heat treatment.

Then, $Ta_2O_5$ or $Nb_2O_5$ dielectric film 26 was formed by chemical vapor deposition method. As precursors, pentaethoxytantalum [$Ta(OC_2H_5)_5$] or pentaethoxyniobium [$Nb(OC_2H_5)_5$] was used in a mixed gas of $N_2/O_2$ at 0.5 Torr (pressure ratio $N_2/O_2$=2/1) with a substrate temperature of 460° C. and a film thickness of 8 nm to form a $Ta_2O_5$ film or a $Nb_2O_5$ film. In order to accelerate crystallization of the dielectric film, heat treatment was conducted in an oxygen stream at 750° C. for 2 minutes. Subsequently, TiN upper electrode 27 was formed by CVD method.

The equivalent oxide thickness (permittivity converted to film thickness of silicon oxide) which is an index for showing properties of dielectric film was 3.1 nm in the case of $Ta_2O_5$ dielectric MIS capacitor, and 2.9 nm in the case of $Nb_2O_5$ dielectric capacitor. These values include capacitance due to low dielectric layer formed at the interface of the $Ta_2O_5$ or $Nb_2O_5$ dielectric and the silicon nitride electrode. Thus, assuming from the difference between both equivalent oxide thicknesses, if the $Ta_2O_5$ dielectric takes the L phase and its permittivity is about 30, the permittivity of the $Nb_2O_5$ is calculated as 37. If the $Ta_2O_5$ dielectric takes hexagonal phase and its permittivity is 60, the permittivity of $Nb_2O_5$ is calculated as 99, and if the $Ta_3O_5$ dielectric takes incomplete hexagonal phase with permittivity of 40, the permittivity of $Nb_2O_5$ is calculated as 54. Since the film thickness is in the stable area of hexagonal $Ta_2O_5$, it is clear that the permittivity of $Nb_2O_5$ is 50 or higher.

Thus the increase of permittivity in $Nb_2O_5$ was confirmed.

EXAMPLE 3

Figure 3:
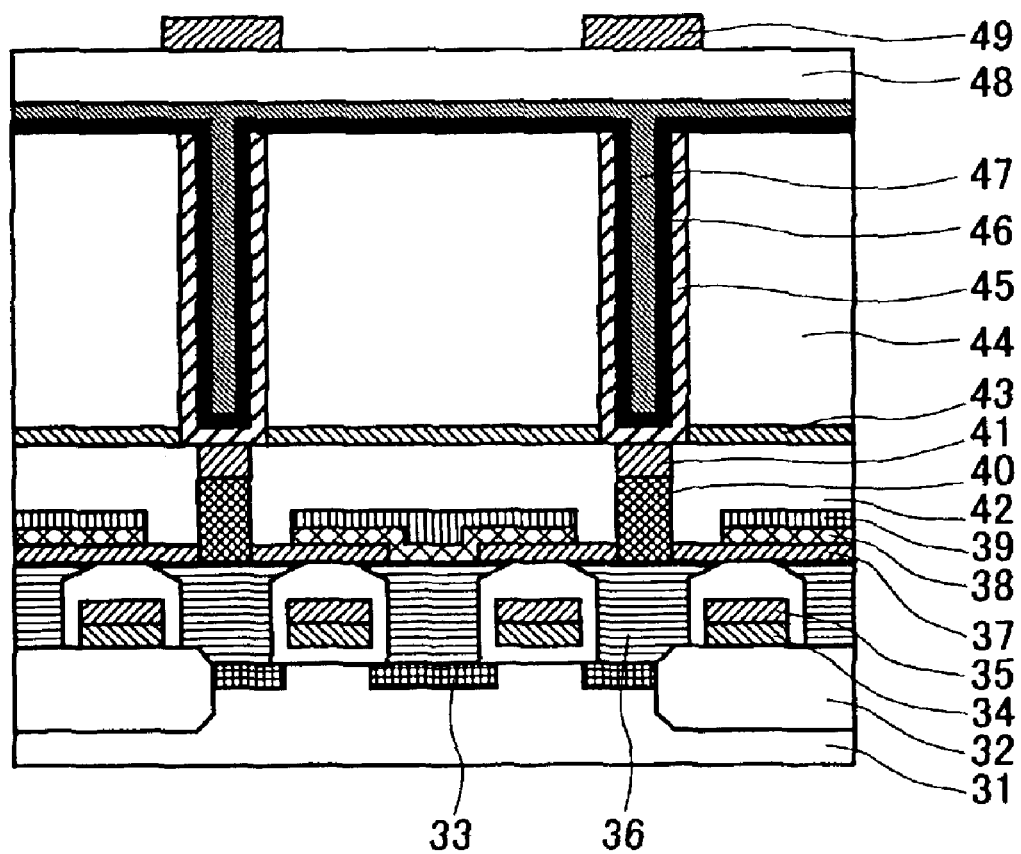
FIG. 3 is a longitudinal cross-sectional view for explaining steps of Example 3 of the present invention.

Example 3 is explained referring to FIG. 3. This Example is to explain a process for producing a semiconductor memory device containing MIM capacitor using a $(Ta,Nb)_2O_5$ solid-solution dielectric layer as capacitor insulating film. In the formation of a $(Ta,Nb)_2O_5$ solid-solution dielectric film by CVD method, this Example is characterized by using a cocktail of raw materials of pentaethoxytantalum and pentaethoxyniobium fed as a single raw material to give the solid-solution film with a predetermined composition.

On a silicon substrate 31, an isolation ($SiO_2$) 32 by thermal oxidation and a diffusion layer 33 by ion doping were formed, followed by formation of a laminate of word line (polysilicon) 34 and word line ($WSi_2$) 35 thereon. Then, on a barrier layer ($Si_3N_4$) 37, a bit line (polysilicon) 38 and a bit line ($WSi_2$) 39 were formed. Further, in a plug portion insulating film 42 made of $SiO_2$, a first plug (polysilicon) 36, a second plug (polysilicon) 40 and a barrier metal (TaN) 41 were formed. By these laminated plugs, the transistor diffusion layer 33 and a lower electrode 45 of capacitor were connected electrically. By these steps, front end steps before forming the capacitor and planarizing step were completed.

Next, an interlaminar insulating film ($Si_3N_4$) 43 and a capacitor portion insulating film ($SiO_2$) film 44 having a film thickness of 1500 nm were deposited by plasma-assisted CVD method using a monosilane gas as a raw material.

After forming a W film by sputtering, a resist was coated to process a W mask by a conventional lithography, followed by dry etching of the capacitor portion insulating film 44 until the surface of the barrier metal 41 to form a deep concave for forming a lower electrode 45. The shape of the concave was an elliptical cylinder at the opening.

Then, a lower Ru electrode 45 having a film thickness of 20 nm was deposited by a chemical vapor deposition method. The lower Ru electrode was formed by using CVD technique wherein a solution obtained by dissolving an organometal complex, bis(ethylcyclopentadienyl) ruthenium [$Ru(C_2H_5C_5H_5)_2$] in tetrahydrofuran [$C_4H_8O$] in a concentration of 0.1 mol/liter was liquid delivered. In a shower head opposite to the substrate, the liquid raw material was mixed with an oxygen gas and a nitrogen gas, followed by blowing to the substrate. The preparation temperature was 290° C. and the pressure was 5 Torr.

Then, a $(Ta,Nb)_2O_5$ solid-solution dielectric film 46 was formed by a chemical vapor deposition method. As precursors, there was used a cocktail raw material of pentaethoxytantalum [$Ta(OC_2H_5)_5$] and pentaethoxyniobium [$Nb(OC_2H_5)_5$]. The composition was represented by the formula: $(Ta_{1-x}Nb_x)_2O_5$, wherein x=0, 0.01, 0.1, 0.3, 0.5, 0.7, 0.9, 0.99, and 1. The supply rate of the cocktail raw material was controlled by a mass-flow meter to form the $(Ta,Nb)_2O_5$ solid-solution dielectric films having the desired compositions. Other preparation conditions were as follows: in $N_2/O_2$ mixed gas at 0.5 Torr (pressure ratio $N_2/O_2$=2/1), substrate temperature 460° C. and film thickness 9 nm. In order to accelerate crystallization of the solid-solution dielectric film, heat treatment was conducted in a nitrogen stream at 650° C. for 2 minutes and in an oxygen stream at 600° C. for 1 minutes.

Subsequently, an upper electrode 47 made of Ru was prepared in the same manner as the lower electrode. On the upper portion of the capacitor, a wiring portion insulating film 48 made of $SiO_2$ and second wiring layers 49 made of W were formed.

Figure 5:
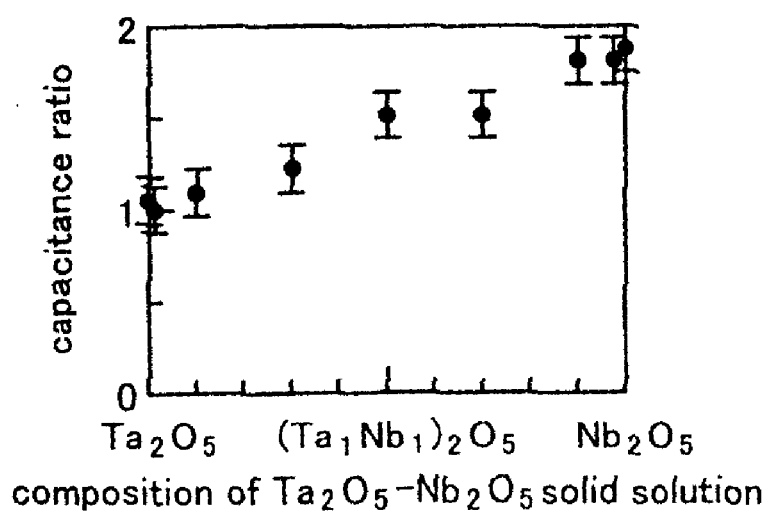
FIG. 5 is a graph for explaining high capacity of the capacitor insulating film made from $(Ta,Nb)_2O_5$ solid solution dielectric film used in the semiconductor device in Example 3.

FIG. 5 shows changes of capacitor capacitance. The capacitor capacitance increases with an increase of the niobium content in the dielectric film and reaches 2-times at most in the pure niobium pentoxide containing no tantalum. Further, no remarkable changes are found in the range of about 1% from pure tantalum pentoxide or pure niobium pentoxide. This means that even if each element is contained as an impurity, there is not effect. From memory operation of this capacitor storage, it was confirmed that the desired properties were obtained.

In this Example, there were used TaN as the barrier metal, Ru metal as upper and lower electrodes to produce the semiconductor device. But, selection of the materials can be conducted broadly; for example, even if Si-doped TaN, TiN, Al-doped TiN, etc. were used, the same effects were obtained. There is no problem when Pt formed by CVD method is used as the lower electrode. As to the upper electrode, when TiN was used other than Pt and Ru, the same effects were obtained.

According to the present invention, it is possible to apply a solid solution of $Ta_2O_5$ and $Nb_2O_5$ having permittivity of 50 to 100 at most to the dielectric film in capacitors stably with good reproducibility. By this, it becomes possible to increase signal amount and to improve reliability of device operation, or to reduce capacitor height and to reduce process charge. Further, since crystals of the hexagonal structure which is an origin of high dielectric constant can be crystallized at a temperature of 600° C., the preparation temperature can be lowered to suppress deterioration of transistor properties. Thus, according to the present invention, it is possible to realize higher integration by miniaturization of semiconductor capacitance devices, simplification of production steps, improvement of yield due to higher reliability, and the like.

What is claimed is:

1. A method for manufacturing a semiconductor device, which comprises
    a step of forming a concavity in an insulating layer,
    a step of forming a lower electrode on at least an inner side wall or bottom surface of the concavity,
    a step of forming a dielectric film having a hexagonal crystal structure and made of a solid solution of tantalum pentoxide and niobium pentoxide or (tantalum, niobium) pentoxide having a thickness of 10 nm or less by a chemical vapor deposition method using a cocktail source of pentaethoxytantalum and pentaethoxyniobium fed as a single raw material on the lower electrode, and
    a step of forming an upper electrode on the dielectric film, thereby producing a capacitor comprising the lower electrode, the dielectric film and the upper electrode.

2. A method according to claim 1, wherein the step of forming the lower electrode is carried out by chemical vapor deposition, wherein a solution obtained by dissolving bis (ethylcyclopentadienyl)-ruthenium in tetrahydrofuran in a concentration of 0.1 mole/liter is liquid transferred.

3. A method according to claim 1, wherein the step of forming the lower electrode is carried out by chemical vapor deposition, wherein a solution obtained by dissolving (methylcyclopentadienyl)-trimethylplatinum in tetrahydrofuran in a concentration of 0.1 mole/liter is liquid transferred.

4. A method for manufacturing a semiconductor memory device, which comprises:
    a step of forming a barrier metal on a plug;
    a step of forming an insulating film on said barrier metal;
    a step of etching said insulating film to form a concave portion for forming a lower electrode of a capacitor until exposing a surface of said barrier metal;
    a step of forming the metal lower electrode of the capacitor on a side wall and on a bottom surface of said concave portion;
    a step of forming a dielectric film having a hexagonal crystal structure and made of a solid solution of tantalum pentoxide and niobium pentoxide or (tantalum, niobium) pentoxide having a thickness of 10 nm or less by a chemical vapor deposition method using a cocktail source of pentaethoxytantalum and pentaethoxyniobium fed as a single raw material on said lower electrode and said insulating film; and
    a step of forming an upper electrode on said dielectric film and said insulation film.

5. A method according to claim 4,
    wherein the step of forming the metal lower electrode is carried out by a chemical vapor deposition method in which a solution obtained by dissolving bis (ethylcyclopentadienyl) ruthenium in tetrahydrofuran in a concentration of 0.1 mole/liter is liquid delivered.

6. A method according to claim 4,
    wherein the step of forming the metal lower electrode is carried out by a chemical vapor deposition method in which a solution obtained by dissolving (methylcyclopentadienyl) trimethylplatinum in tetrahydrofuran in a concentration of 0.1 mole/liter is liquid delivered.

7. A method according to claim 4,
wherein the step of forming the barrier metal is carried out by forming an aluminum-doped titanium nitride film.

8. A method for manufacturing a semiconductor memory device, which comprises:
- a step of forming a polysilicon plug;
- a step of forming an insulating film on said polysilicon plug;
- a step of etching said insulating film to form a concave portion for forming a lower electrode of a capacitor until exposing a surface of said polysilicon plug;
- a step of forming a polysilicon electrode of the capacitor on a side wall and on a bottom surface of said concave portion;
- a step of forming a dielectric film having a hexagonal crystal structure and made of a solid solution of tantalum pentoxide and niobium pentoxide or (tantalum, niobium) pentoxide having a thickness of 10 nm or less by a chemical vapor deposition method using a cocktail source of pentaethoxytantalum and pentaethoxyniobium fed as a single raw material over said polysilicon electrode and said insulating film; and
- a step of forming an upper electrode on said dielectric film and said insulating film.

9. A method according to claim 8, wherein the step of forming the polysilicon electrode is carried out by forming an uneven surface on said polysilicon electrode.

10. A method according to claim 8,
wherein after the step of forming the polysilicon electrode, a step of forming a silicon nitride film on said polysilicon electrode is carried out.

* * * * *